United States Patent
Hansen

(10) Patent No.: US 10,795,267 B2
(45) Date of Patent: Oct. 6, 2020

(54) MODEL FOR ESTIMATING STOCHASTIC VARIATION

(71) Applicant: ASML NETHERLANDS B.V., Veldhoven (NL)

(72) Inventor: Steven George Hansen, Phoenix, AZ (US)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/462,569

(22) PCT Filed: Nov. 17, 2017

(86) PCT No.: PCT/EP2017/079683
§ 371 (c)(1),
(2) Date: May 21, 2019

(87) PCT Pub. No.: WO2018/099742
PCT Pub. Date: Jun. 7, 2018

(65) Prior Publication Data
US 2019/0317410 A1  Oct. 17, 2019

Related U.S. Application Data

(60) Provisional application No. 62/429,253, filed on Dec. 2, 2016.

(51) Int. Cl.
| | |
|---|---|
| *G03B 27/54* | (2006.01) |
| *G03F 7/20* | (2006.01) |
| *G06F 7/70* | (2006.01) |

(52) U.S. Cl.
CPC .......... *G03F 7/705* (2013.01); *G03F 7/70558* (2013.01); *G06F 7/70* (2013.01)

(58) Field of Classification Search
CPC .. G03F 7/705; G03F 7/70558; G03F 7/70608; G03F 7/70616; G03F 7/70625; G06F 7/70
See application file for complete search history.

(56) References Cited

U.S. PATENT DOCUMENTS

| | | | |
|---|---|---|---|
| 5,969,441 | A | 10/1999 | Loopstra et al. |
| 7,587,704 | B2 | 9/2009 | Ye et al. |
| 8,050,898 | B2 | 11/2011 | Hansen |
| 9,213,783 | B2 | 12/2015 | Hansen |
| 2009/0157360 | A1 | 6/2009 | Ye et al. |
| 2011/0112809 | A1 | 5/2011 | Biafore et al. |

(Continued)

OTHER PUBLICATIONS

International Search Report and Written Opinion issued in corresponding PCT Patent Application No. PCT/EP2017/079683, dated Mar. 22, 2018.

(Continued)

*Primary Examiner* — Peter B Kim
(74) *Attorney, Agent, or Firm* — Pillsbury Winthrop Shaw Pittman LLP

(57) ABSTRACT

A method including: obtaining a resist process dose sensitivity value for a patterning process; applying the resist process dose sensitivity value to a stochastic model providing values of a stochastic variable as a function of resist process dose sensitivity to obtain a value of the stochastic variable; and designing or modifying a parameter of the patterning process based on the stochastic variable value.

20 Claims, 10 Drawing Sheets

(56) References Cited

U.S. PATENT DOCUMENTS

2013/0179847 A1* 7/2013 Hansen .................. G06F 17/50
716/54
2016/0085155 A1 3/2016 Jung et al.

OTHER PUBLICATIONS

Biafore, John J., et al.: "Application of Stochastic Modeling to Resist Optimization Problems", Proc. of SPIE, vol. 8325, Mar. 14, 2012.
Biafore, John J., et al.: "Mechanistic Simulation of Line-Edge Roughness", Proc. of SPIE, vol. 6519, Mar. 5, 2007.
Nomura, Haruyuki, et al.: "Study on Modeling of Resist Heating Effect Correction in EB Mask Writer EBM-9000", Proc. of SPIE, vol. 9658, Jul. 9, 2015.
Smith. Mark D., et al.: "Comprehensive EUV Lithography Model", Proc. of SPIE, vol. 7969, No. 1, Mar. 17, 2011.

* cited by examiner

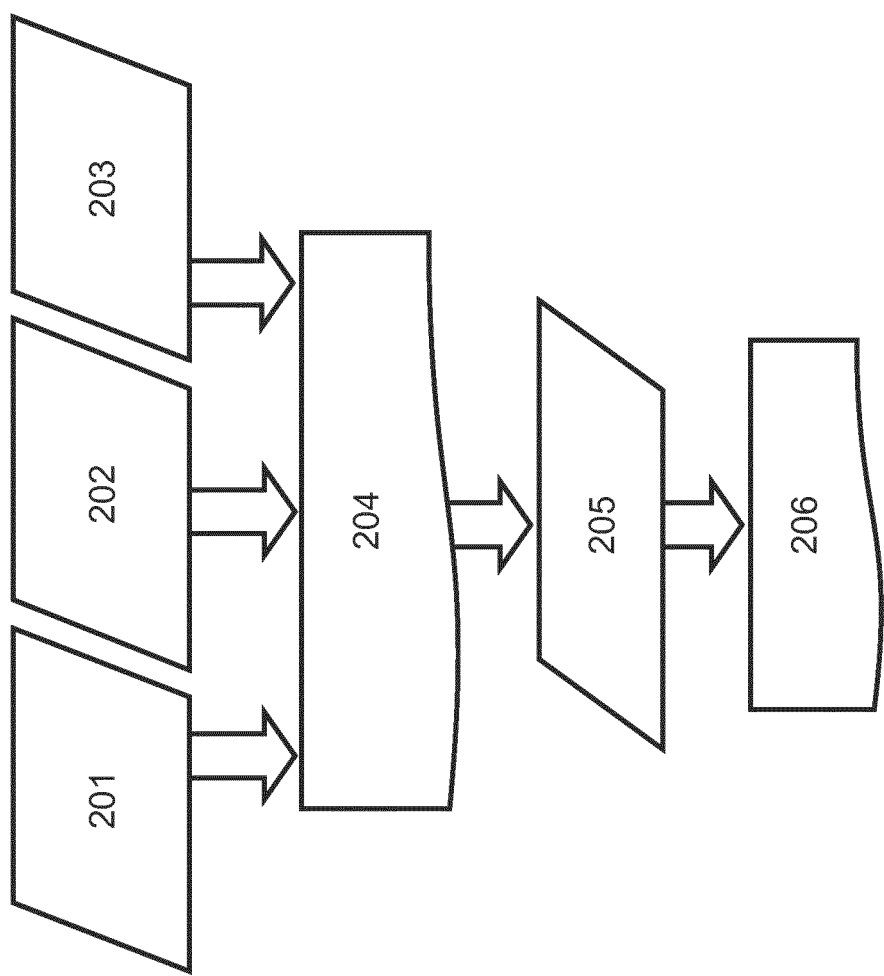

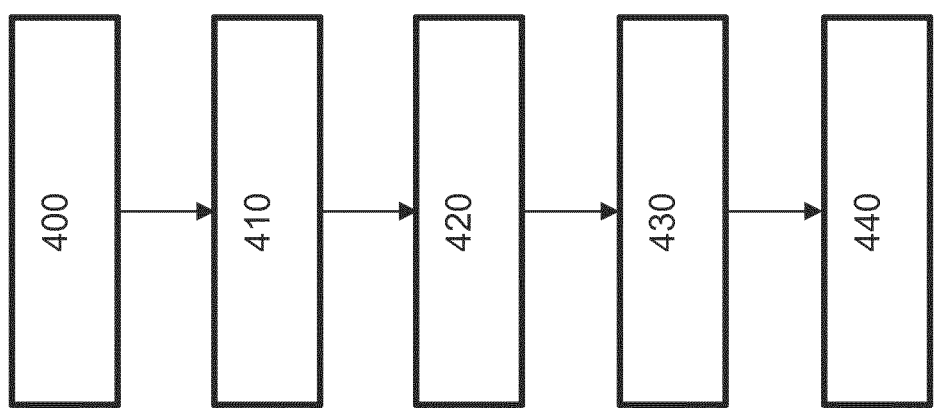

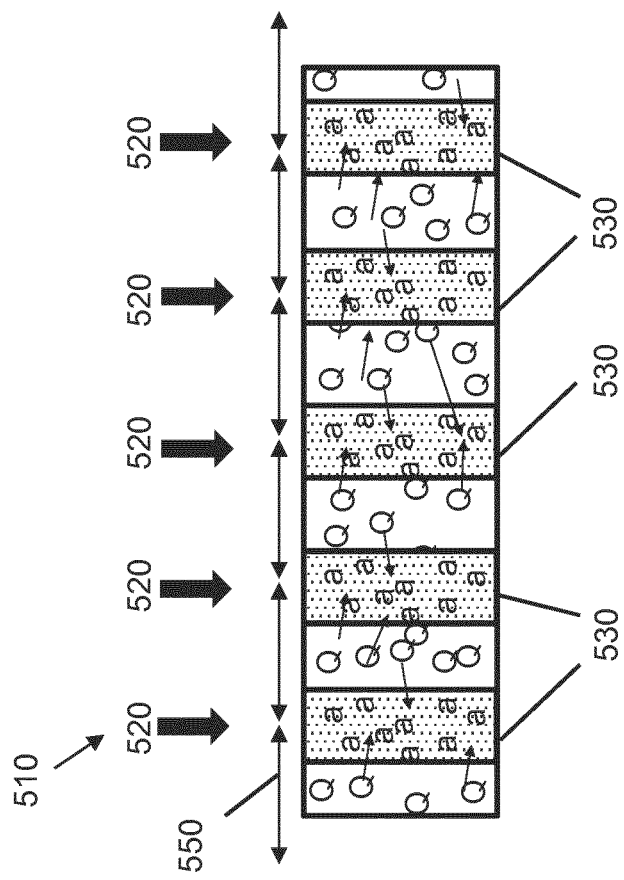
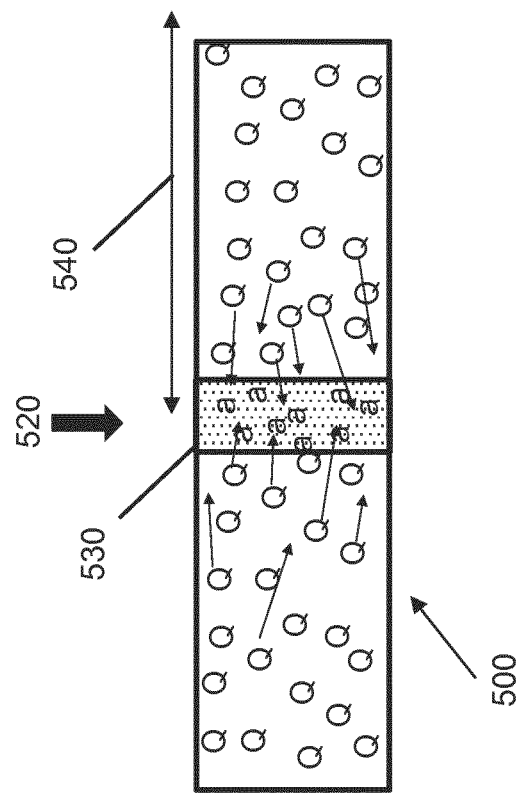
Fig. 5B
Fig. 5A

MODEL FOR ESTIMATING STOCHASTIC VARIATION

CROSS-REFERENCE TO RELATED APPLICATIONS

This application is the U.S. national phase entry of PCT patent application no. PCT/EP2017/079683, which was filed on Nov. 17, 2017, which claims the benefit of priority of U.S. provisional application No. 62/429,253, which was filed on Dec. 2, 2016, and which is incorporated herein in its entirety by reference.

FIELD

The description herein relates to a patterning process and apparatus thereof and more specifically to a stochastic variation therein.

BACKGROUND

A lithography apparatus can be used, for example, in the manufacture of integrated circuits (ICs). In such a case, a patterning device (e.g., a mask) may contain or provide a device pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern of the patterning device. In general, a single substrate contains a plurality of adjacent target portions to which the pattern is transferred successively by the lithography apparatus, one target portion at a time. In one type of lithography apparatus, the pattern of the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern of the patterning device are transferred to one target portion progressively. Since, in general, the lithography apparatus will have a magnification factor M (generally <1), the speed F at which the substrate is moved will be a factor M times that at which the projection beam scans the patterning device.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern of the patterning device to a substrate and typically, but optionally, involves one or more related pattern processing steps, such as resist development by a development apparatus, baking of the substrate using a bake tool, etching using the pattern using an etch apparatus, etc.

SUMMARY

In an embodiment, there is provided a method comprising: obtaining a resist process dose sensitivity value for a patterning process; applying, by a hardware computer, the resist process dose sensitivity value to a stochastic model providing values of a stochastic variable as a function of resist process dose sensitivity to obtain a value of the stochastic variable; and designing or modifying a parameter of the patterning process based on the stochastic variable value.

In an embodiment, there is provided a method comprising: obtaining predictions of resist process dose sensitivity from a lithographic model of a patterning process; obtaining measured values of a stochastic variable of the patterning process; and calibrating, by a hardware computer, a model-based stochastic model predicting values of the stochastic variable, based on the predicted resist process dose sensitivities and the measured values of the stochastic variable.

In an embodiment, there is provided a method comprising: calculating, by a hardware computer, a value of stochastic variable from a stochastic model of a patterning process, the stochastic model providing values of the stochastic variable as a function of a resist quencher parameter; and designing or modifying a parameter of the patterning process based on the stochastic variable value.

In an embodiment, there is provided a method comprising: obtaining resist quencher parameter values for a patterning process; obtaining measured values of a stochastic variable of the patterning process; and calibrating, by a hardware computer, a model predicting a value of the stochastic variable, based on the resist quencher parameter values and the measured values of the stochastic variable.

In an embodiment, there is provided a computer program product comprising a computer non-transitory readable medium having instructions recorded thereon, the instructions when executed by a computer implementing a method as described herein.

BRIEF DESCRIPTION OF THE DRAWINGS

FIG. 3 illustrates a block diagram of simulation models corresponding to subsystems in FIG. 1;

FIG. 4 illustrates an embodiment of the flow of a method of deriving a calibrated stochastic model that predicts a stochastic variable and applying the calibrated stochastic model to obtain a value of the stochastic variable;

FIG. 5A schematically illustrates a situation of a relatively large pitch feature arrangement showing resist quencher mobility and photon reaction of the chemically amplified resist causing acid release and interaction of the exposed portion with the resist quencher;

FIG. 5B schematically illustrates a situation of a relatively small pitch feature arrangement showing resist quencher mobility and photon reaction of the chemically amplified resist causing acid release and interaction of the exposed portion with the resist quencher;

DETAILED DESCRIPTION OF THE DRAWINGS

Figure 1:
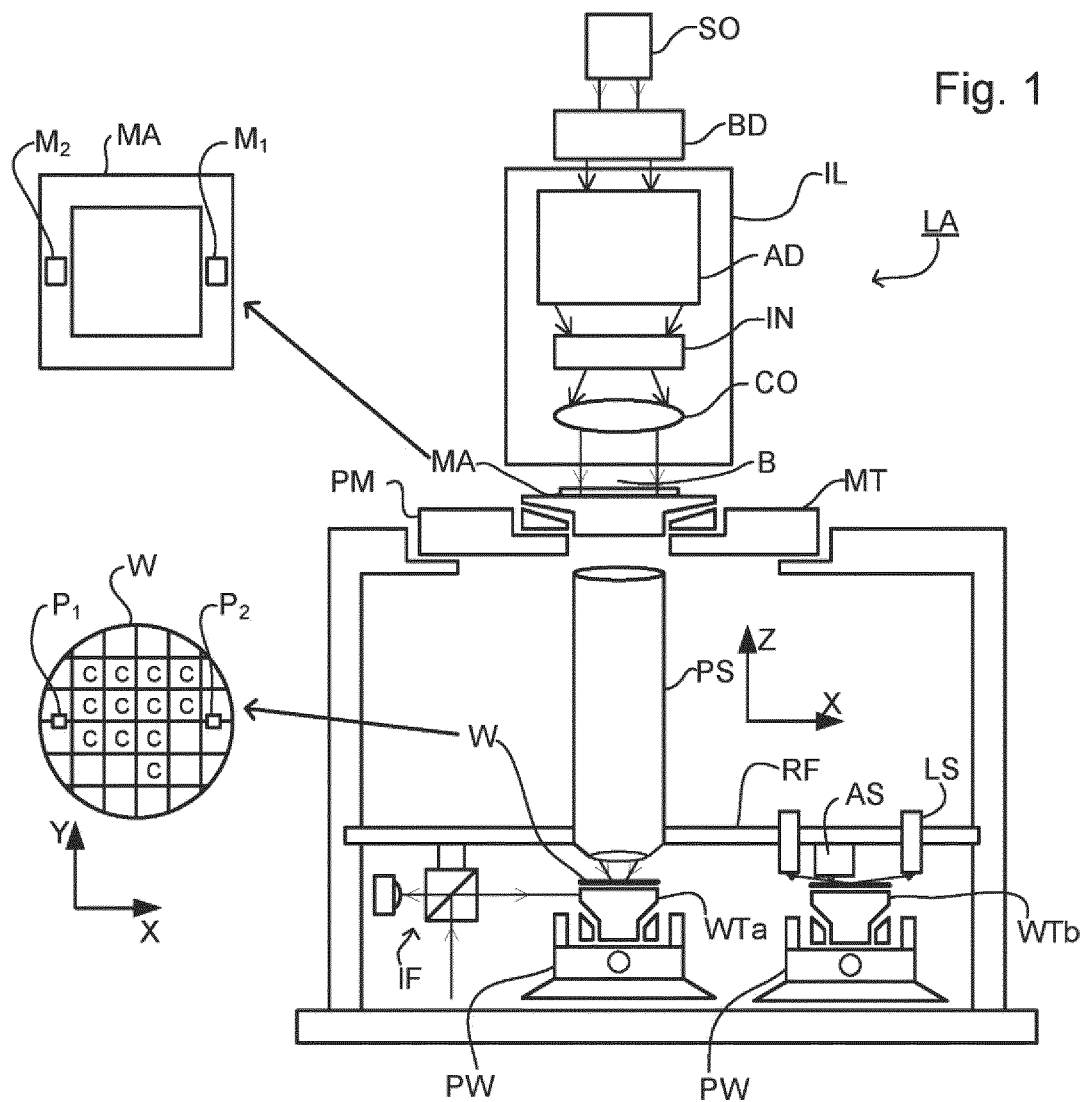
FIG. 1 illustrates a schematic diagram of a lithography apparatus.

FIG. 1 schematically depicts a lithographic apparatus LA in association with which the techniques described herein can be utilized. The apparatus includes an illumination optical system (illuminator) IL configured to condition a radiation beam B (e.g., ultraviolet (UV) radiation, deep ultraviolet (DUV) radiation or extreme ultraviolet (EUV) radiation), a patterning device support or support structure (e.g., a mask table) MT constructed to support a patterning device (e.g., a mask) MA and connected to a first positioner PM configured to accurately position the patterning device in accordance with certain parameters; one or more substrate tables (e.g., a wafer table) WTa, WTb constructed to hold a substrate (e.g., a resist coated wafer) W and connected to a second positioner PW configured to accurately position the substrate in accordance with certain parameters; and a projection optical system (e.g., a reflective, refractive, catoptric or catadioptric optical system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation. In this particular case, the illumination system also comprises a radiation source SO.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix. Another example is a LCD matrix.

As here depicted, the apparatus is of a transmissive type (e.g., employing a transmissive patterning device). However, the apparatus may be of a reflective type (e.g., employing a programmable mirror array of a type as referred to above, or employing a reflective mask) and employing reflective elements in the illumination system and projection system.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO (e.g., a mercury lamp or excimer laser, an EUV source such as a LPP (laser produced plasma) EUV source). The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the spatial and/or angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers, is described further below.

Lithographic apparatus LA in this example is of a so-called dual stage type which has two substrate tables WTa, WTb and two stations an exposure station and a measurement station between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS, measuring the position of alignment markers on the substrate using an alignment sensor AS, performing any other type of metrology or inspection, etc. This enables a substantial increase in the throughput of the apparatus. More generally, the lithography apparatus may be of a type having two or more tables (e.g., two or more substrate tables, a substrate table and a measurement table, two or more patterning device tables, etc.). In such "multiple stage" devices a plurality of the multiple tables may be used in parallel, or preparatory steps may be carried out on one or more tables while one or more other tables are being used for exposures. Twin stage lithography apparatuses are described, for example, in U.S. Pat. No. 5,969,441, incorporated herein by reference in its entirety.

While a level sensor LS and an alignment sensor AS are shown adjacent substrate table WTb, it will be appreciated that, additionally or alternatively, a level sensor LS and an alignment sensor AS can be provided adjacent the projection system PS to measure in relation to substrate table WTa.

The depicted apparatus can be used in a variety of modes, including for example a step mode or a scan mode. The construction and operation of lithographic apparatus is well known to those skilled in the art and need not be described further for an understanding of the embodiments of the present invention.

Figure 2:
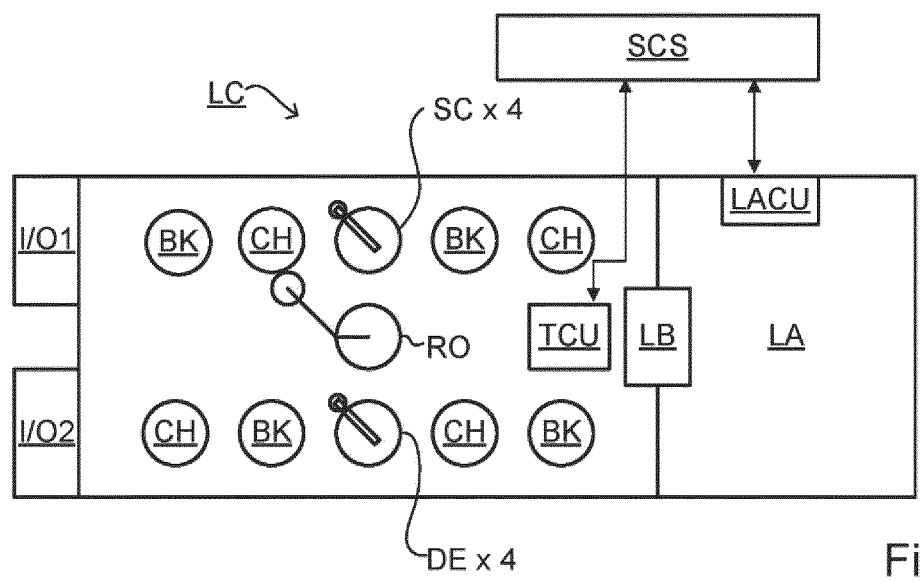
FIG. 2 depicts an embodiment of a lithographic cell or cluster.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

The patterning device referred to above comprises, or can form, one or more design layouts or patterns (hereinafter design pattern for convenience). The design pattern can be generated utilizing CAD (computer-aided design) programs, this process often being referred to as EDA (electronic design automation). Most CAD programs follow a set of predetermined design rules in order to create functional design patterns/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. One or more of the design rule limitations may be referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

So, in a lithography apparatus, an illumination system provides illumination (i.e. radiation) in the form of an illumination mode to a patterning device and the projection system directs and shapes the illumination, via the patterning device, onto a substrate via aerial image (AI). The illumination mode defines the characteristics of the illumination, such as the angular or spatial intensity distribution (e.g., conventional, dipole, annular, quadrupole, etc.), an illumination sigma (G) setting, etc. The aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer.

Now, to enable patterning process design, control, monitoring, etc., one or more parts of the patterning process can be mathematically modelled and/or simulated. For example, the lithographic process can be simulated/modeled to analyze how an input design pattern layout is imaged by a lithographic apparatus under specific conditions. Thus, a simulation will typically be performed that mathematically models the imaging by a lithography apparatus.

An exemplary flow chart for simulating lithography in a lithography apparatus is illustrated in FIG. 3. An illumination model 201 represents optical characteristics (including radiation intensity distribution and/or phase distribution) of the illumination provided to the patterning device. A projection system model 202 represents optical characteristics (including changes to the radiation intensity distribution and/or the phase distribution caused by the projection system) of the projection system. A design pattern model 203 represents optical characteristics (including changes to the radiation intensity distribution and/or the phase distribution caused by a given design pattern layout 203) of a design pattern layout, which is the representation of an arrangement of features on or formed by a patterning device. An aerial image 204 can be simulated from the design pattern model 203, the projection system model 202 and the design pattern model 203. A resist image 206 can be simulated from the aerial image 204 using a resist model 205. Simulation of lithography can, for example, predict contours and CDs in the resist image.

More specifically, it is noted that the illumination model 201 can represent the optical characteristics of the illumination mode and/or illumination system that include, but not limited to, a numerical aperture setting, an illumination sigma (G) setting, a particular illumination shape (e.g. off-axis radiation illumination such as annular, quadrupole, dipole, etc.), etc. The projection system model 202 can represent the optical characteristics of the projection system, including aberration, distortion, one or more refractive indexes, one or more physical sizes, one or more physical dimensions, etc. The design pattern model 203 can represent one or more physical properties of a physical patterning device, as described, for example, in U.S. Pat. No. 7,587,704, which is incorporated by reference in its entirety. The resist model can be used to calculate the resist image from the aerial image, an example of which can be found in U.S. Patent Application Publication No. US 2009-0157360, the disclosure of which is hereby incorporated by reference in its entirety. The resist model is related to properties of the resist layer (e.g., optical density, effects of chemical processes which occur during exposure, PEB and development). Optical properties of the lithography apparatus (e.g., properties of the illumination mode, the patterning device and the projection system) dictate the aerial image. Since the patterning device used in the lithography apparatus can be changed, it may be desirable to separate the optical properties of the patterning device from the optical properties of the rest of the lithography apparatus including at least the illumination system and the projection system.

So, an objective of the simulation is to accurately predict, for example, edge placement, aerial image intensity slope, and/or CD, which can then be compared against an intended design. This prediction can be performed for various conditions, such as various dose, focus, etc. conditions. The intended design is generally defined as a pre-optical proximity correction (OPC) design pattern which can be provided in a standardized digital file format such as GDSII or OASIS or other file format.

As part of a patterning process of a device pattern on a substrate, a resist layer is typically provided on a substrate for creating a latent image therein of a device pattern from a patterning device. Thereafter, the resist is developed to produce a developed image therein, wherein different portions of the resist have different solubility. Typically, a bake is performed between exposure and development to thermally induce a chemical reaction in the resist. The resist is in some cases chemically amplified. Exposure causes acid release in a chemically amplified resist, and acid diffusion facilitates resist sensitivity to exposure (dose) and affects feature edge/width roughness.

So, to help enable understanding of how an image comes to be created in the resist, mathematical modeling and/or simulation are performed to predict the outcome of patterning the resist with a particular pattern. The mathematical modeling and/or simulation predicts how a resist realizes an image therein based on a pattern exposed on the resist. The mathematical modeling and/or simulation thus enables patterning process design, control, modification, etc. For example, the mathematical modeling and/or simulation can be used to estimate feature edge/width roughness (line edge/width roughness) in a patterning process, to detect pattern features likely to be or become defective (hotspots), and/or to redesign processes (such as illumination and patterning device pattern optimization, sometimes referred to as source mask optimization) to reduce stochastic effects. Thus, there is provided a lithographic model to enable obtaining values of one or more parameters pertaining to the patterning of a pattern using a lithographic process.

In an embodiment, one such model is a calibrated image-based model that assumes that the substrate printing closely resembles the projected optical image convolved with an appropriate Gaussian function (i.e. a blurred image). For example, in an example of such a model (e.g., in the form of an OPC model), feature dependent resist process dose sensitivity (i.e., the amount of change in the resist per amount of change in dose, e.g., the amount of change in edge position of an image feature in the resist per amount of change in dose) is tuned with measured substrate data to provide a more accurate estimate than from a blurred aerial image alone. Example of such a model is described in U.S. Pat. Nos. 8,050,898 and 9,213,783, which are incorporated herein in their entirety by reference.

So, in this case, a purely image-based (e.g., blurred image) lithographic model can be supplemented or replaced with a calibrated lithographic model to predict pattern feature edge position and dose sensitivity, wherein the calibrated lithographic model is calibrated using measured data. The calibrated lithographic model can give a better prediction than obtainable by using the blurred image lithographic model alone. So, in an embodiment, the blurred image lithographic model can be effectively a subset of the calibrated lithographic model. That is, the two models would give the same, or highly similar, results when the blurred image lithographic model adequately predicts pattern feature edge positions and dose sensitivities.

But, while this approximation works, it may not accurately represent certain processes. For example thicker resist film processes, where dissolution properties are significant, and negative-tone development processes, where material shrinkage is significant, can differ significantly from a blurred image. Thus, errors may be seen when comparing measured feature edge/width roughness data to a calibrated lithographic model. Therefore, as discussed in further detail hereafter, there is provided a model that can accurately predict a stochastic variation (such as feature edge/width roughness) of an image feature formed in resist on a substrate.

Without being limited to any theory or hypothesis, a potential reason for the failure in the matching is that the dissolution properties of the resist film yield a feature-dependent effect on exposure dose sensitivity. For this reason, exposure dose sensitivity of the resist cannot be deduced for all features by simply analyzing the blurred image.

So, in an embodiment, the calibrated lithographic model or a mere image-based (e.g., blurred image) lithographic model approach can be supplemented or replaced for the purposes of estimating a stochastic variable with a model that predicts a stochastic variable. So, in this approach, a stochastic variable can be taken directly from the model that predicts the stochastic variable and yield a more accurate result than a calibrated lithographic model or a blurred image lithographic model.

In an embodiment, this model to predict a stochastic variable is a model-based stochastic model. That is, it is parameterized/calibrated using information regarding a parameter (e.g., dose sensitivity) determined from a lithographic model, such as the calibrated lithographic model. Further, this model-based stochastic model is calibrated with measured data relating to the stochastic variable that it predicts. Thus, the result is a calibrated model-based stochastic model that predicts a value of a stochastic variable. Moreover, the calibrated model-based stochastic model can give a better stochastic variable prediction than obtainable by using a lithographic model alone.

Further, a lithographic model, such as the calibrated lithographic model, can be used to determine a value of the parameter (e.g., dose sensitivity) for a pattern of interest. This determined value of the parameter can be used as the input to the calibrated model-based stochastic model in order to predict a value of the stochastic variable.

In an embodiment, the stochastic variable is feature edge roughness (herein also referred to as line edge roughness (LER)) or feature width roughness (herein also referred to as line width roughness (LWR)). While the discussion herein focuses on LER and LWR for convenience as the stochastic variation, the stochastic variable could additionally or alternatively be a different measure. In an embodiment, the LWR is LER multiplied by $\sqrt{2}$.

Referring to FIG. 4, an embodiment of the flow of a method of deriving the calibrated model-based stochastic model and applying it is depicted. At optional step 400, a lithographic model (e.g. an optical proximity correction model, a full physical model, blurred image model, etc.) is fitted to a patterning process based on a pattern/structure (hereinafter referred to as simply pattern (or patterns) for convenience) and measurements that derive a dose used in the patterning process (other variables, such as focus, are optional). This fitting results in a calibrated lithographic model. In an embodiment, this calibration can involve exposing one or more substrates to one or more patterns with a varying dose and then obtaining the results of measurements of those exposed patterns (e.g., test patterns). For example, test patterns can be exposed with varying nominal dose values and then measured to determine values of one or more spatial parameters (e.g., CD) which are used to calibrate the model. For example, a known focus exposure matrix type calibration can be performed to expose at varying dose to determine associated critical dimension measurements for the calibration. In an embodiment, the spatial parameter (e.g., CD) values can be obtained through pitch using various patterns. Through this calibration using measured values of a spatial parameter, such as CD, obtained at different doses, the calibrated lithographic model can provide a better prediction of dose sensitivity.

At 410, a calibrated model-based stochastic model to predict a stochastic variable is derived. In an embodiment, this begins with a stochastic model that provides a stochastic variable output (in this case, LER). The stochastic model can comprise the following power law:

$$LER = a \times (DS)^b \qquad (Eq. 1)$$

wherein LER is line edge roughness in a patterning process, DS is dose sensitivity of the resist of the patterning process, and a and b are coefficients. The coefficients a and b are derived through fitting with measured results as, for example, described below.

In an embodiment, the stochastic model is calibrated by obtaining LER measurements relating to exposed patterns using the patterning process. For example, test patterns can be exposed and then measured to obtain LER. In an embodiment, the LER can be measured from the same patterns used to calibrate the lithographic model at 400. In an embodiment, the LER values are obtained for numerous locations on the patterns.

Further, for the set of patterns for which LER was measured, a lithographic model (e.g., the calibrated lithographic model at 400) can calculate the dose sensitivity of the resist for each pattern. For example, slight perturbations to a dose value can be applied within the lithographic model to obtain resist value changes and thus the corresponding dose sensitivity. In an embodiment, the dose sensitivity values are obtained for numerous locations on the patterns.

So, with the LER data and dose sensitivity data, equation (1) can be fitted to the data through appropriate selection of coefficients a and b. At this point, there is provided a calibrated model-based stochastic model that is based on a lithographic model and calibrated with measured stochastic variable data. The calibrated model-based stochastic model can then be used in patterning process design, control, monitoring, modification, etc. In an embodiment, by combining measured stochastic variable data (e.g. LER) for various edge locations of a pattern of interest (e.g., a device pattern) and using modeled dose sensitivity values and location values for those edge locations derived from a calibrated lithographic model, a better stochastic variable prediction can be obtained because both the dose sensitivity and mean edge locations are more accurate than the predictions of a simple blurred image model and the calibrated model-based stochastic model can provide a better prediction of the stochastic variable from the data obtained from the calibrated lithographic model for the pattern of interest.

At 420, the calibrated model-based stochastic model can then be used in relation to any pattern, such as a device pattern for manufacturing. For example, for a device pattern of interest, the dose sensitivity for the device pattern can be calculated using a lithographic model (e.g., the calibrated lithographic model at 400). In an embodiment, the lithographic model is used to calculate a nominal pattern (edge positions) at best focus and best dose. Then, the pattern (edge positions) is re-calculated using a small fixed dose offset to obtain the corresponding change in the pattern (edge positions). So, the change in pattern as a function of change of the dose provides the dose sensitivity. In an embodiment, the dose sensitivity is obtained for each of a plurality of edge positions so as to define a spatial dose sensitivity profile for one or more features of the device pattern.

At 430, the calibrated model-based stochastic model from 410 is then used to calculate a stochastic variable based on the dose sensitivities from 420. In an embodiment, the stochastic variable (e.g., LER) is calculated at a plurality of edge points of the device pattern. Thus, for example, a spatial LER profile is provided for one or more features of the device pattern or the entire pattern. One or more other stochastic variables than LER can be used or derived from LER. For example, LWR can be derived by comparing two adjacent edges.

At 440, the LER values can be used to draw one or more stochastic variability bands in respect of one or more features of the device pattern. For example, the LER values output by the calibrated model-based stochastic model can represent a certain number of standard deviations of variation (e.g., 3 standard deviations). So, the LER values can be obtained for a plurality of locations along an edge of a pattern. Then, those LER values can be used to create a band about an edge position of a device feature that represents the stochastic variability (e.g., 3 standard deviations). For example, the band is spaced from the edge position by the respective LER values. In an embodiment, such a band can be defined on opposite sides of the edge (e.g., +3σ and −3σ variability), i.e., there is a band at a distance of the LER values on one side and a band at a distance of the LER values on the other side. In an embodiment, the edge position is an expected or design edge position. In an embodiment, the edge position is an average (e.g., mean) edge position determined from a lithographic model (e.g., an OPC model). Such bands can be used in patterning process design, modification, control, etc. since the bands can indicate the possibility of adjacent features contacting each other, which can lead to a defect. In an embodiment, the LER values can be multiplied by an appropriate unit noise vector to produce a rough, realistic, stochastic pattern edge.

So, in an embodiment, it is recognized that stochastic edge position variation depends on the stochastic dose variation and the dose sensitivity. So, the effective dose, and therefore dose noise, is constant at the developed pattern edge and so local stochastic variation is given mostly, if not entirely, by local dose sensitivity. So, the techniques described herein aim to obtain a more accurate model of the stochastic variation. In particular, in an embodiment, a calibrated lithographic model, such as a calibrated OPC model, is used to predict dose sensitivity data for certain patterns. Those patterns are exposed and the applicable stochastic variable is measured from those patterns. With the dose sensitivity predictions and the measured stochastic variable, a stochastic model that predicts the stochastic variable can be fit to the data to obtain a calibrated model-based stochastic model. The calibrated stochastic model can be then be used with any other pattern by predicting the dose sensitivity for that pattern using a lithographic model (such as a calibrated lithographic model) and then obtaining a value of the stochastic variable from the calibrated model-based stochastic model.

While evaluation of dose sensitivity is significant to obtaining a measure of a stochastic variable, dose sensitivity may not fully describe the stochastic behavior. In particular, it has been discovered that quencher added to the resist to facilitate chemical contrast can play a significant role in the stochastic variation and that a measure in relation to quencher can be used to more effectively realize a measure of a stochastic variable.

More specifically, it has been discovered that certain characteristics of the resist quencher have a particular effect on a stochastic effect such as LER/LWR. For example, the quencher loading Q (i.e., concentration of quencher in the resist), the nature of the diffusion of the quencher in the resist, e.g. quencher diffusivity QD or diffusion length of the quencher in the resist, i.e., quencher diffusion length QDL, and a measure of the amount of unexposed portion of resist adjacent an exposed portion, e.g., the pitch between exposed portions, have an effect. QDL can be defined by the following equation:

$$QDL = (2 \times QD \times t)^{0.5} \quad \text{(Eq. 2)}$$

where t is the bake time.

Referring to FIG. 5, an impact of quencher is schematically depicted. FIG. 5A shows a resist 500 exposed by radiation 520 to produce an exposed resist portion 530 with unexposed portions of resist on either side in the form of a pattern. In this situation, the pattern has a relatively large pitch 540. Further shown are the acid labelled "a" in the exposed portion and quencher labelled "Q" in the unexposed portions. During lithography, the illumination of the patterning device pattern on the resist causes acid release. Further, quencher molecules Q diffuse toward the edge of the exposed portion 530. As seen in this situation, the relatively large pitch provides fairly large 'reservoirs' of quencher that could diffuse to the edges of the exposed portion 530, neutralize photo-acid, and affect imaging characteristics including dose sensitivity.

Considering now FIG. 5B, it shows a resist 500 exposed by radiation 520 to produce exposed resist portions 530 with unexposed portions of resist on either side of each exposed resist portion 530 in the form of a pattern. In this situation, the pattern has a smaller pitch 550 than in FIG. 5A. Like FIG. 5A, there are shown the acid labelled "a" in the exposed portions and quencher labelled "Q" in the unexposed portions. During lithography, the illumination of the patterning device pattern on the resist causes acid release. Further, quencher molecules Q diffuse toward the edge of the exposed portions 530. As seen in this situation, the relatively small pitch provides fairly small 'reservoirs' of quencher so that less quencher could diffuse to the edges of the exposed portions 530.

So, when comparing the situations in FIGS. 5A and 5B, a relatively lower amount of quencher can diffuse in FIG. 5B which may create a pitch-dependent quencher effect. This effect should be particularly large when the quencher has a relatively long diffusion length as shown in FIG. 5A. The additional flux of quencher at the image edge in FIG. 5A can better sharpen the latent image and reduce dose sensitivity.

So, FIG. 5 provides insight that the quencher diffusivity and quencher diffusion length may contribute to a stochastic variable such as LER/LWR, e.g., LER/LWR varies with quencher diffusivity. For example, quencher diffusivity or quencher diffusion length has an impact on dose sensitivity. In particular, dose sensitivity varies with quencher diffusivity (QD) or with quencher diffusion length (QDL), e.g., high QD decreases dose sensitivity. Thus, quencher diffusivity or quencher diffusion length has an additional impact on the relationship between dose sensitivity and the stochastic variable, e.g., high QD creates less stochastic variation.

Figure 6:
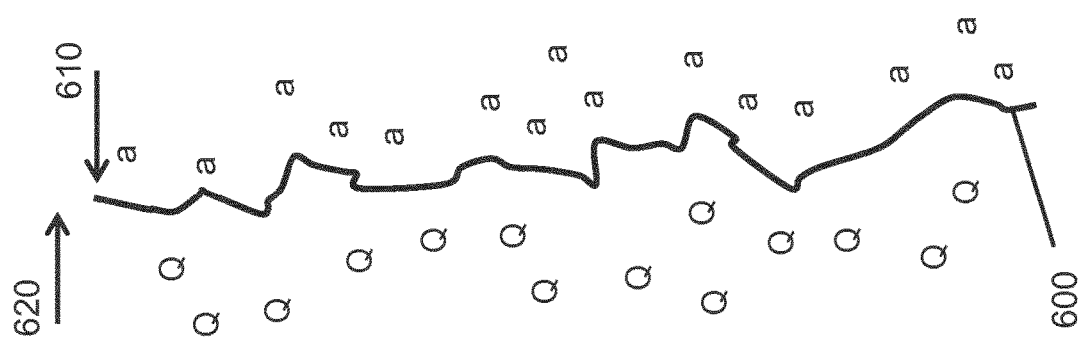
FIG. 6 schematically illustrates a feature-dependent resist quencher "smoothing" effect.

To help quantify and model these effects, the concept of quencher flux can be used and quantified. The quencher flux concept is based on the premise that in-flow of reactants to an exposed portion tends to reduce variation. FIG. 6 schematically shows that after initial acid:base neutralization, quencher is in excess on one side and acid is in excess on the other side of an exposed portion edge 600, wherein there is depicted a net flow 610 of acid (labelled by "a") and a net flow 620 of quencher (labelled by "Q"). In particular, the quencher flow toward the higher acid portion on the other side of the edge 600 will encounter a projection part of the edge 600 into the unexposed portion earlier than other parts of the edge 600. Thus, quencher flowing to the right into a higher acid region will first encounter (and neutralize) acid regions projecting to the left. Similarly, acid net flow to the left will "blunt" the projections. So, "dynamic" neutralization effects may smooth the edge 600 somewhat. So, this smoothing of the edge 600 is likely a function of the "quencher flux", which depends on Q relative concentration and QDL, and when QDL is large enough, the size of the quencher reservoir (e.g., as measured by feature pitch).

Thus, a new parameter related to the smoothing of the edge feature can be introduced. In particular, a quencher smoothing factor (QSF) can be introduced. In an embodiment, QSF can be defined as follows:

$$\text{QSF(QDL,}Q\text{,pitch)}=1-c\cdot Q\text{flux} \tag{Eq. 3}$$

where QSF depends on QDL, the quencher loading Q, and pitch, where Qflux is quencher flux, and where c is a coefficient. While pitch is used as the means to provide a measure of the quencher reservoir and will be focused on hereinafter for convenience, a different geometric dimension can be used to provide a measure of the quencher reservoir. For example, a length or width of the reservoir, a distance between exposed portions, an area of the reservoir, a volume of the reservoir, etc. Moreover, while a single type or version of a geometric dimension is described, it will be appreciated different types or versions of geometric dimension can be used. For example, pitches in two or more directions can be used, a pitch and area can be used, etc.

So, in an embodiment, the quenching smoothing factor can be included in the model of equation (1) to yield a model comprising the following:

$$\text{LER}=[a\cdot(\text{DS})^b]\cdot(1-c\cdot Q\text{flux} \tag{Eq. 4}$$

wherein QSF can have the form of equation (3). Thus, there can be provided an enhanced model-based stochastic model (i.e. with the quencher flux considered) having the following equation:

$$\text{LER}=[a\cdot(\text{DS})^b]\cdot(1-c\cdot Q\text{flux}) \tag{Eq. 5}$$

Figure 7:
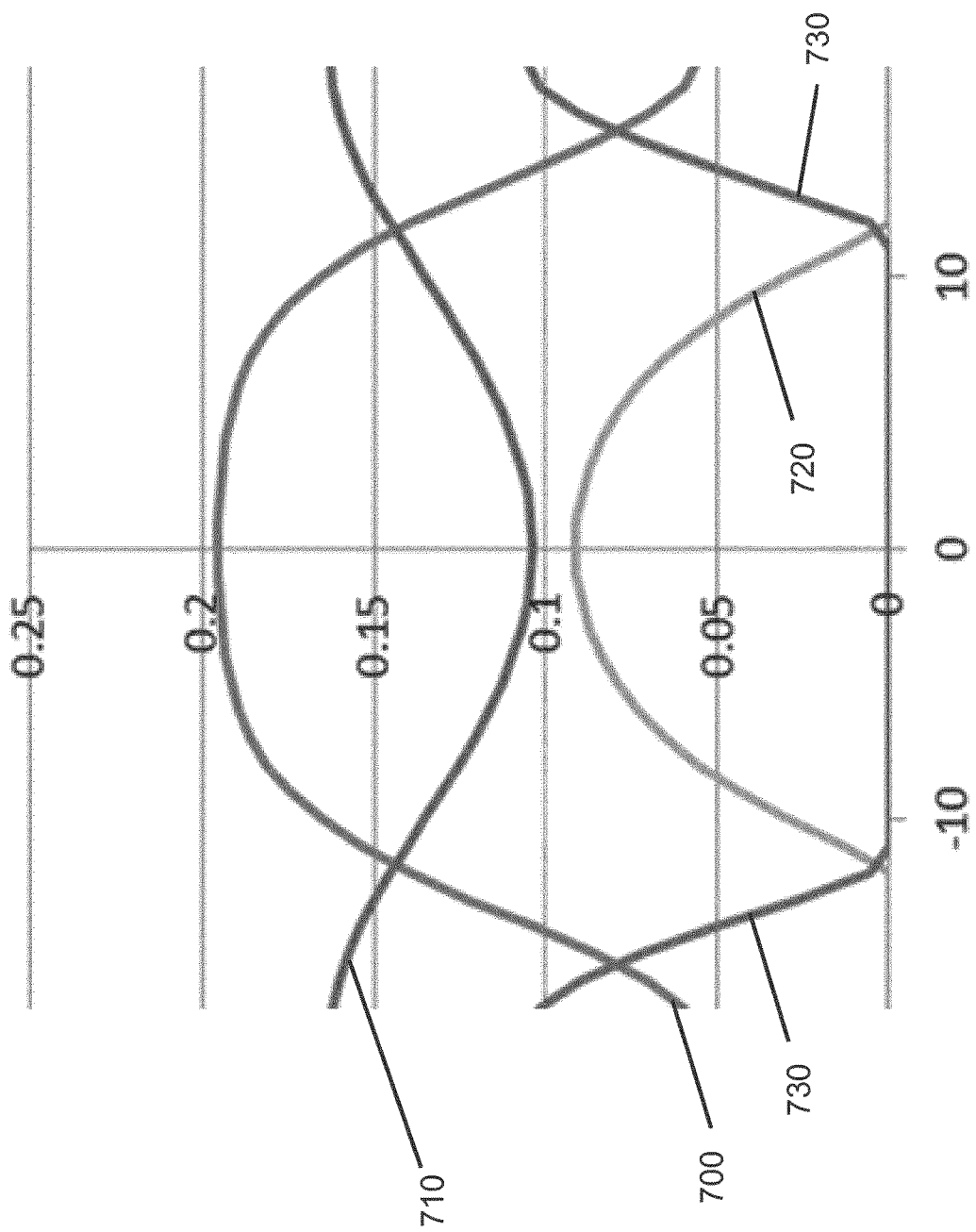
FIG. 7 schematically illustrates distribution of acid and quencher loading (Q) relative to a pattern feature.

FIG. 7 shows a schematic example of acid and quencher amount distribution in respect of an 18 nm feature at 36 nm pitch. The horizontal axis describes the position in nanometers with respect to the feature with the zero marking the center of the feature. The vertical axis describes the quencher and acid concentration in arbitrary units. So, curve 700 describes the acid concentration after exposure and can be seen mostly located within the feature. These curves can be obtained via resist model/simulation. Further, curve 710 describes the quencher concentration after exposure and can be seen to be higher outside the feature. The curve 710 shows a minimum at feature center because this example assumes the quencher can be decomposed by the radiation. Curve 720 then depicts the net acid at the start of the bake and curve 730 depicts the net quencher at the start of the bake assuming a rapid acid:base reaction. So, the transition from the curve 710 to the curve 730 describes the quencher reservoir. So, it can be that the size of the quencher reservoir is affected by the pitch of the features.

Figure 8:
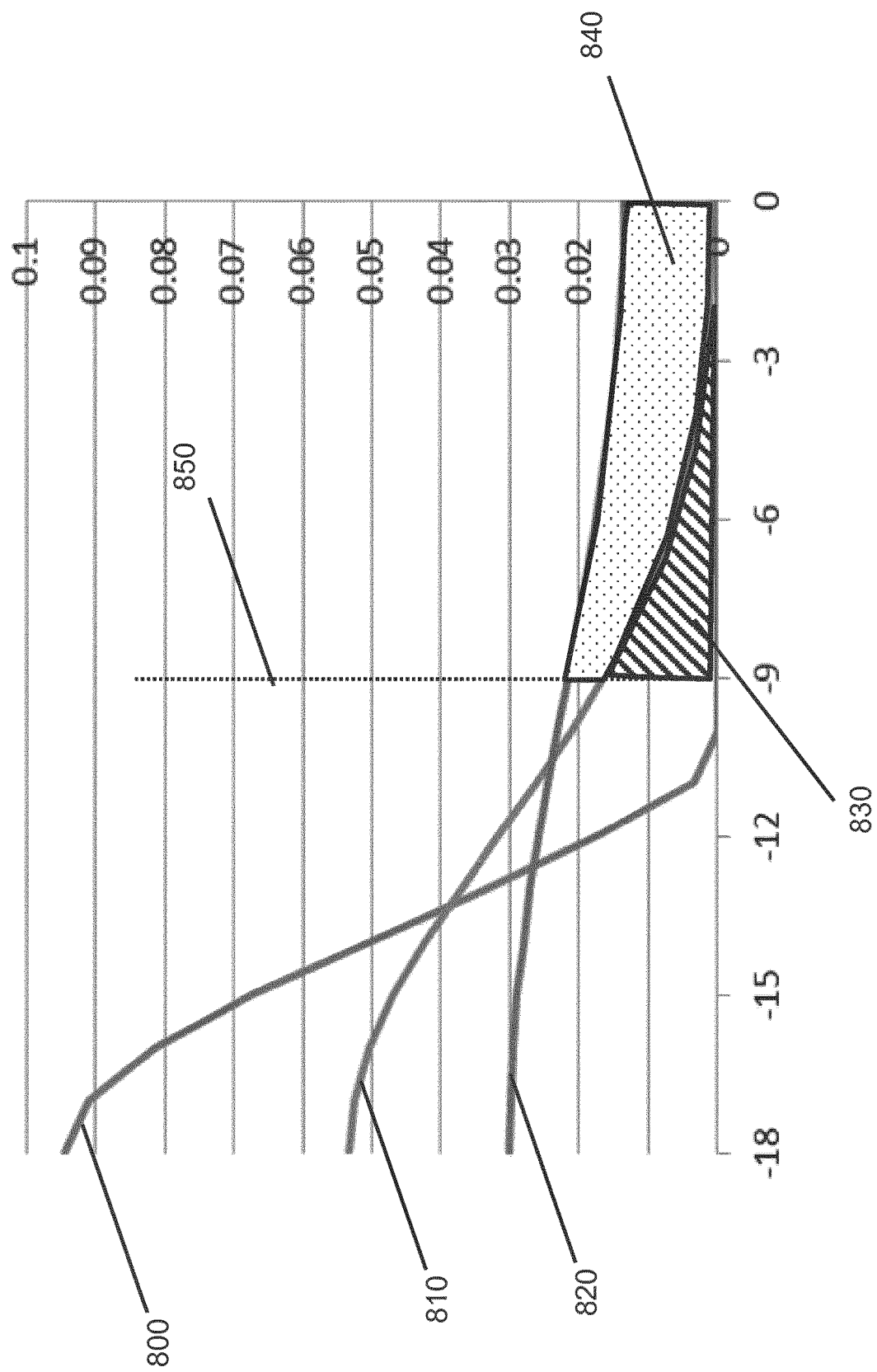
FIG. 8 illustrates an example of resist quencher diffusion into the feature for several resist quencher diffusion lengths (QDL)

FIG. 8 shows a further schematic example of the quencher loading distribution in respect of an 18 nm feature at 36 nm pitch. This data can be obtained via resist model/simulation. The horizontal axis describes the position in nanometers with respect to the feature with the zero marking the center of the feature. The vertical axis describes the quencher concentration in arbitrary units. Curve 800 shows the quencher concentration after rapid acid:base neutralization (such as curve 700 in FIG. 7), that is the initial net quencher distribution. Further, curve 810 shows a result of the convolution of a Gaussian distribution of 5 nm/1σ with the curve 800. This approximates the quencher distribution, after bake, assuming a QDL of 5 nm. Further, curve 820 shows a results of a convolution of a Gaussian distribution of 10 nm/1σ with the curve 800, corresponding to an after bake quencher distribution assuming a QDL of 10 nm. These curves are further shown in respect of the feature edge 850. So, the regions 830 and 840 provide the quencher flux with respect to the feature for the specific quencher reservoir (i.e., the region of −9 to −18 nm). Specifically, the 5 nm quencher diffusion length distribution yields the region 830 passing the feature edge. Further, the 10 nm quencher diffusion length distribution would add the region 840. So, this procedure provides estimates for quencher flux as a function of pitch and quencher diffusion length and allows an analytical approximation to be made.

Figure 9:
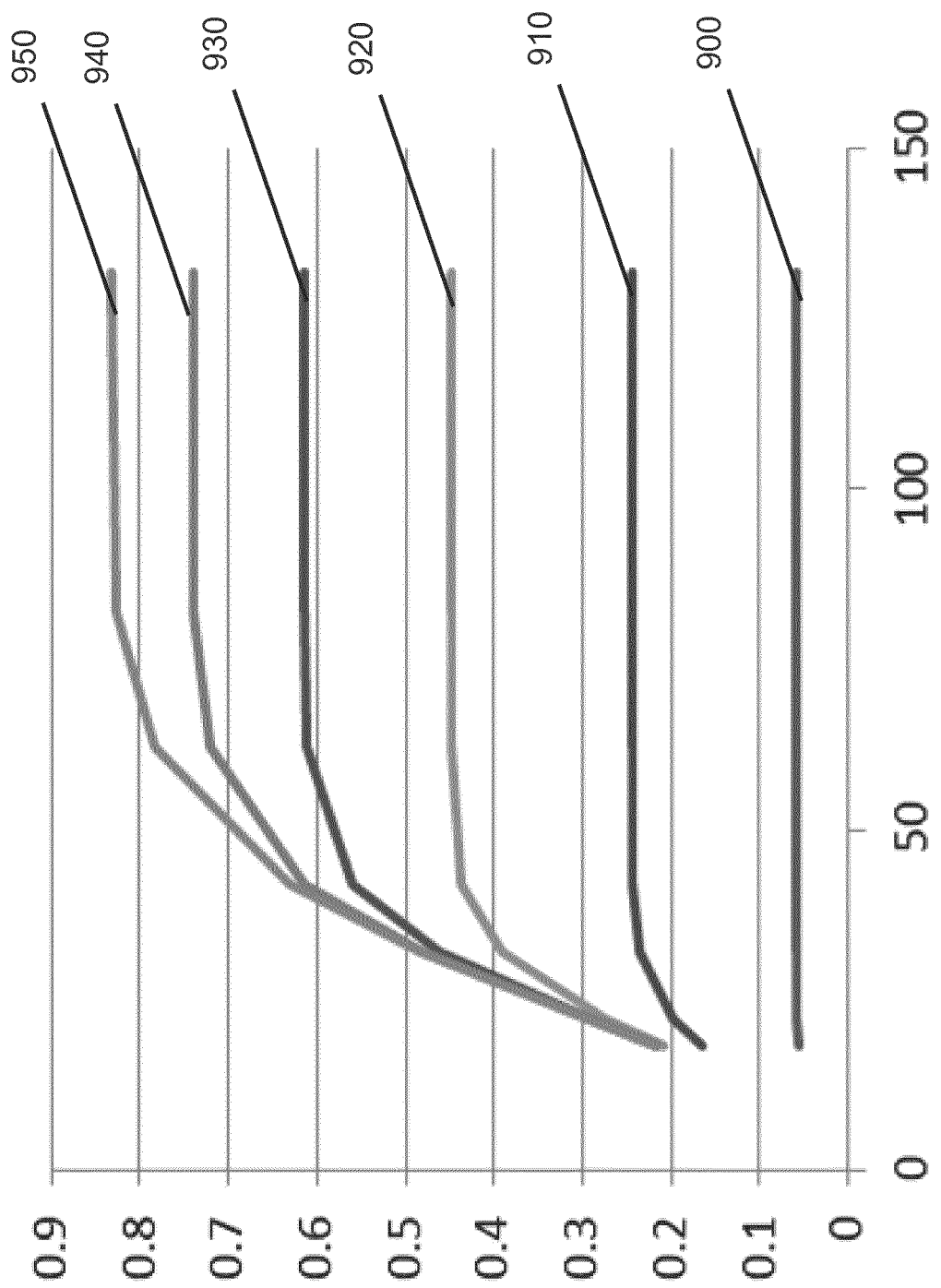
FIG. 9 illustrates an example of pitch dependence of resist quencher diffusion flux (Qflux) for various resist quencher diffusion lengths (QDL)

FIG. 9 then shows an example of quencher flux as a function of pitch for a particular feature size and for each of a plurality of quencher diffusion lengths. The horizontal axis is pitch of a feature of particular size. The vertical axis describes the quencher flux in arbitrary units. This data can be obtained via resist model/simulation. The curves correspond to different quencher diffusion lengths. For example, curves 900, 910, 920, 930, 940, and 950 can correspond to 5 nm, 10 nm, 15 nm, 20 nm, 25 nm and 30 nm quencher diffusion lengths respectively. As will be appreciated this analysis can be performed for various other kinds of quencher diffusion lengths and for other particular feature sizes. Thus, from this data, a quencher flux value can be obtained for various pitches at various quencher diffusion lengths. Also, as expected, low diffusion lengths have low pitch dependence while large diffusion lengths transport much more quencher across the feature edge with large pitches with large quencher reservoirs.

Figure 10:
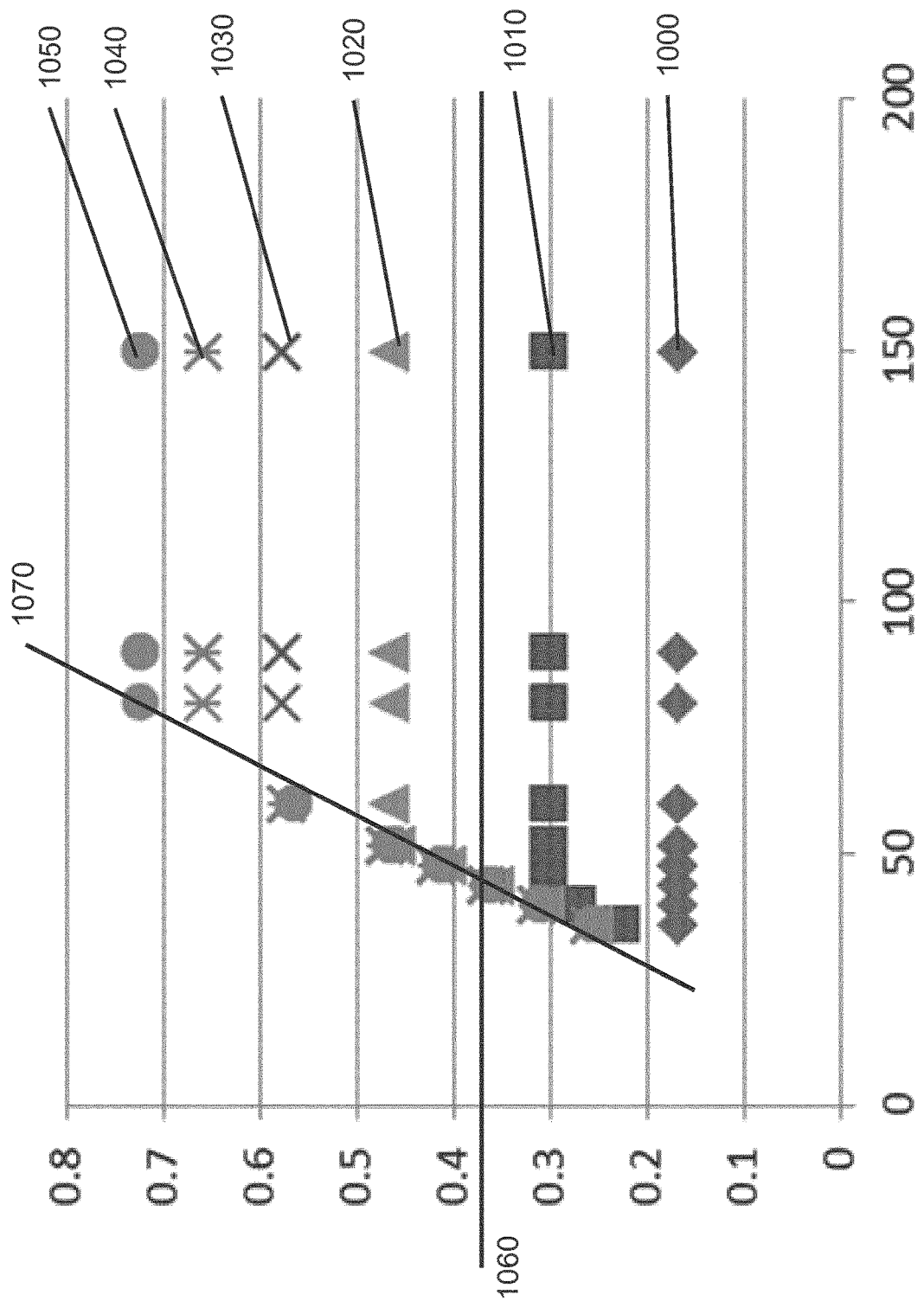
FIG. 10 illustrates another example of pitch dependence of resist quencher diffusion flux (Qflux) for various resist quencher diffusion lengths (QDL) with a line indicating a saturation level.

FIG. 10 shows a further example of quencher flux as a function of pitch for a particular feature size and for each of a plurality of quencher diffusion lengths. The horizontal axis is pitch of a feature of particular size. The vertical axis describes the quencher flux in arbitrary units. This data can be obtained via resist model/simulation. The sets of data correspond to different quencher diffusion lengths. For example, data 1000, 1010, 1020, 1030, 1040, and 1050 can correspond to 7.7 nm, 11 nm, 15.5 nm, 19 nm, 21.9 nm and 24.5 nm quencher diffusion lengths respectively. So, from this data, a quencher flux value can be obtained for various pitches with different diffusion lengths.

Further, it can also be useful to consider saturation of the quencher flux effect, i.e., flux above that level has no meaningful additional effect on stochastic response. So, for example, any quencher flux above a threshold such as the line 1060 shown in FIG. 10 can be truncated to the threshold level.

So, in an embodiment, similar to the embodiment described with respect to FIG. 4, values of a stochastic variable, such as LER/LWR, can be obtained from measurement of a particular pattern and quencher flux values can be derived for the pattern from the data described above in respect of FIGS. 9 and 10 above. For example, a look-up table, or an analytical approximation, of the data in FIGS. 9 and 10 above for various pitches, various feature sizes, various quencher diffusion lengths, etc. In an embodiment, the quencher flux data can be obtained from a function of pitch only (i.e., not dependent on quencher diffusion length). For example, line 1070 shows an example such function of quencher flux with respect to pitch that doesn't require any assumption or specification of quencher diffusion length).

Then, a model can be fit to the stochastic variable and quencher flux data to obtain a parameterized model. In an embodiment, the model comprises 1−c·Qflux, wherein coefficient c is obtained from the fitting.

In an embodiment, dose sensitivity is also used in fitting a model for the stochastic variable. Thus, in an embodiment, the model can take the form of equation (5), wherein coefficients a, b and c are obtained through the fitting. Optionally, a coefficient such as b can fixed with a reasonable estimate and then the other coefficients can be found through the fitting.

In an embodiment, a quencher flux saturation point can improve the results and thus a coefficient d can be introduced that specifies the threshold level 1060. The coefficient d can be obtained through the fitting process along with the coefficient c and, where applicable, obtained with the coefficients a and b.

So, with a parameterized model of a stochastic variable (e.g., LER/LWR) as a function of quencher flux, the stochastic variable can be predicted for a particular pattern like described with respect to 430 and then used for patterning process design, modification, control, etc. such as at 440.

Thus, while stochastic behavior could be approximated by a blurred image, an improvement, as described above, was to use modeled dose sensitivity to arrive at a model-based stochastic model that models a stochastic variable (LER/LWR) as a function of dose sensitivity. As a further enhancement, it is recognized that high quencher diffusivity influences stochastic behavior several ways, such as affecting feature/pitch-dependent dose sensitivity, and providing a smoothing mechanism through quencher flux across a feature edge. Thus, the stochastic variable can be modeled as a function of quencher flux, e.g., modeled as a function of dose sensitivity and quencher flux. So, an enhanced calibrated stochastic model considers the feature-based effect of quencher flux. The calibrated stochastic model can closely match substrate data and the calibrated stochastic model can be more accurate than a conventional lithographic model.

In an embodiment, the techniques described herein are particularly useful for EUV resists.

In an embodiment, there is provided a method comprising: obtaining a resist process dose sensitivity value for a patterning process; applying, by a hardware computer, the resist process dose sensitivity value to a stochastic model providing values of a stochastic variable as a function of resist process dose sensitivity to obtain a value of the stochastic variable; and designing or modifying a parameter of the patterning process based on the stochastic variable value.

In an embodiment, the function of resist process dose sensitivity comprises: $[a \cdot (DS)^b]$ where DS is resist process dose sensitivity and a and b are fitted coefficients. In an embodiment, the stochastic variable comprises feature edge or width roughness. In an embodiment, the stochastic model provides values of the stochastic variable as function of a resist quencher parameter. In an embodiment, the resist quencher parameter is resist quencher flux. In an embodiment, the function of resist quencher flux comprises: (1−c·Qflux) wherein Qflux is resist quencher flux and c is a fitted coefficient. In an embodiment, the function of resist quencher flux and resist process dose sensitivity comprises: $[a \cdot (DS)^b] \cdot (1-c \cdot Qflux)$. In an embodiment, the method further comprises creating a stochastic process variability band, based on the stochastic variable value, with respect to a pattern edge position, or producing a stochastic pattern edge by multiplying the stochastic variable value with a unit noise vector. In an embodiment, the method comprises creating the stochastic process variability band, based on the stochastic variable value, with respect to the pattern edge position, wherein the pattern edge position is an average edge position obtained from a lithographic model. In an embodiment, obtaining the resist process dose sensitivity value comprises using a lithographic model of the patterning process to compute the resist process dose sensitivity value based on a device pattern. In an embodiment, the method further comprises: obtaining predictions of resist process dose sensitivity from a lithographic model of the patterning process; obtaining measured values of the stochastic variable; and calibrating the stochastic model based on the predicted resist process dose sensitivities and the measured values of the stochastic variable. In an embodiment, the lithographic model comprises an optical proximity correction model, a full physical model, and/or a blurred image model. In an embodiment, the method comprises obtaining resist quencher flux values and calibrating the stochastic model based on resist quencher flux values. In an embodiment, the calibrating comprises determining an upper-bound of the resist quencher flux values as part of fitting the resist quencher flux values to the stochastic model. In an embodiment, values of the stochastic variable are dependent on a geometric dimension of a space between features of a pattern used in the patterning process.

In an embodiment, there is provided a method comprising: obtaining predictions of resist process dose sensitivity from a lithographic model of a patterning process; obtaining measured values of a stochastic variable of the patterning process; and calibrating, by a hardware computer, a model-based stochastic model predicting values of the stochastic variable, based on the predicted resist process dose sensitivities and the measured values of the stochastic variable.

In an embodiment, the lithographic model comprises an optical proximity correction model, a full physical model, and/or a blurred image model. In an embodiment, the model-based stochastic model comprises a function of resist process dose sensitivity comprising: $[a \cdot (DS)^b]$ where DS is resist process dose sensitivity and a and b are fitted coefficients. In an embodiment, the stochastic variable comprises feature edge or width roughness. In an embodiment, the model-based stochastic model provides values of the stochastic variable as function of a resist quencher parameter. In an embodiment, the resist quencher parameter is resist quencher flux. In an embodiment, the function of resist quencher flux comprises: (1−c·Qflux) wherein Qflux is resist quencher flux and c is a fitted coefficient. In an embodiment, the function of resist quencher flux and resist process dose sensitivity comprises: $[a \cdot (DS)^b] \cdot (1-c \cdot Qflux)$. In an embodiment, the method comprises obtaining resist quencher flux values and calibrating the model-based stochastic model based on resist quencher flux values. In an embodiment, the calibrating comprises determining an upper-bound of the resist quencher flux values as part of fitting the resist quencher flux values to the model-based stochastic model. In an embodiment, values of the stochastic variable are dependent on a geometric dimension of a space between features of a pattern used in the patterning process.

In an embodiment, there is provided a method comprising: calculating, by a hardware computer, a value of stochastic variable from a stochastic model of a patterning process, the stochastic model providing values of the stochastic variable as a function of a resist quencher parameter; and designing or modifying a parameter of the patterning process based on the stochastic variable value.

In an embodiment, the stochastic variable comprises feature edge or width roughness. In an embodiment, the stochastic model provides values of the stochastic variable as function of resist quencher flux. In an embodiment, the function of resist quencher flux comprises: $(1-c \cdot Qflux)$ wherein Qflux is resist quencher flux and c is a fitted coefficient. In an embodiment, the function of resist quencher flux comprises: $[a \cdot (DS)^b] \cdot (1-c \cdot Qflux)$ wherein DS is resist process dose sensitivity and a and b are fitted coefficients. In an embodiment, the method further comprises creating a stochastic process variability band, based on the stochastic variable value, with respect to a pattern edge position, or producing a stochastic pattern edge by multiplying the stochastic variable value with a unit noise vector. In an embodiment, the method comprises creating the stochastic process variability band, based on the stochastic variable value, with respect to the pattern edge position, wherein the pattern edge position is an average edge position obtained from a lithographic model. In an embodiment, the method further comprises: obtaining resist quencher parameter values; obtaining measured values of the stochastic variable; and calibrating the stochastic model based on the resist quencher parameter values and the measured values of the stochastic variable. In an embodiment, the method comprises obtaining predicted resist process dose sensitivity values and calibrating the stochastic model based on the predicted resist process dose sensitivity values. In an embodiment, the calibrating comprises determining an upper-bound of the resist quencher flux values as part of fitting the resist quencher flux values to the stochastic model. In an embodiment, values of the stochastic variable are dependent on a geometric dimension of a space between features of a pattern used in the patterning process.

In an embodiment, there is provided a method comprising: obtaining resist quencher parameter values for a patterning process; obtaining measured values of a stochastic variable of the patterning process; and calibrating, by a hardware computer, a model predicting a value of the stochastic variable, based on the resist quencher parameter values and the measured values of the stochastic variable.

In an embodiment, the stochastic variable comprises feature edge or width roughness. In an embodiment, the resist quencher parameter is resist quencher flux. In an embodiment, the function of resist quencher flux comprises: $(1-c \cdot Qflux)$ wherein Qflux is resist quencher flux and c is a fitted coefficient. In an embodiment, the function of resist quencher flux comprises: $[a \cdot (DS)^b] \cdot (1-c \cdot Qflux)$ wherein DS is resist process dose sensitivity and a and b are fitted coefficients. In an embodiment, the method comprises obtaining resist process dose sensitivity predictions and calibrating the model based on the resist process dose sensitivity predictions. In an embodiment, the calibrating comprises determining an upper-bound of the resist quencher parameter values as part of fitting the resist quencher parameter values to the model. In an embodiment, values of the stochastic variable are dependent on a geometric dimension of a space between features of a pattern used in the patterning process.

As will be appreciated by one of ordinary skill in the art, the present application may be embodied as a system, method, or computer program product. Accordingly, aspects of the present application may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present application may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present application may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments may be implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present application has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

Figure 11:
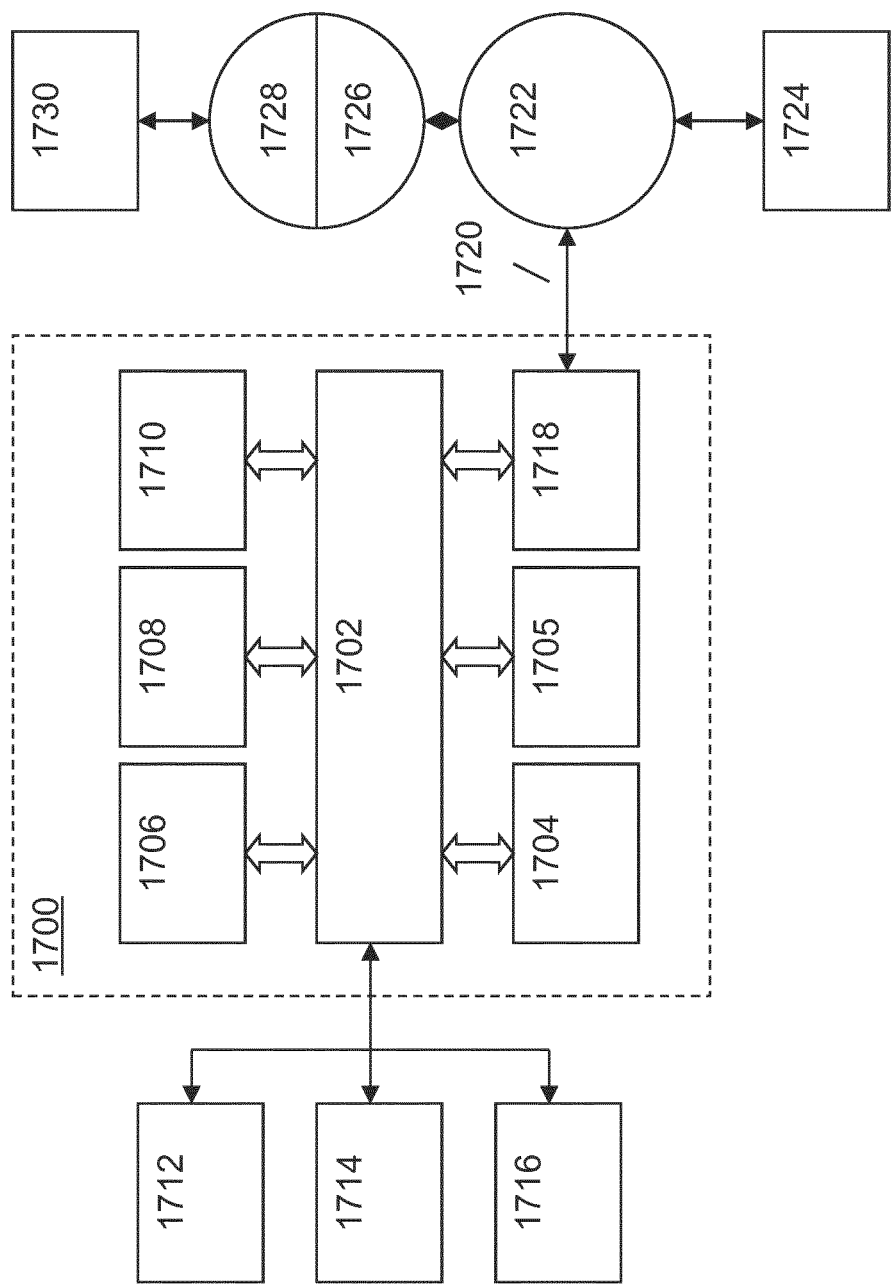
FIG. 11 illustrates a block diagram that illustrates an embodiment of a computer system which can assist in implementing any of the methods and flows disclosed herein.

FIG. 11 shows a block diagram that illustrates an embodiment of a computer system 1700 which can assist in implementing any of the methods and flows disclosed herein. Computer system 1700 includes a bus 1702 or other communication mechanism for communicating information, and a processor 1704 (or multiple processors 1704 and 1705) coupled with bus 1702 for processing information. Computer system 1700 also includes a main memory 1706, such as a random access memory (RAM) or other dynamic storage device, coupled to bus 1702 for storing information and instructions to be executed by processor 1704. Main memory 1706 also may be used for storing temporary variables or other intermediate information during execution of instructions to be executed by processor 1704. Computer system 1700 further includes a read only memory (ROM) 1708 or other static storage device coupled to bus 1702 for storing static information and instructions for processor 1704. A storage device 1710, such as a magnetic disk or optical disk, is provided and coupled to bus 802 for storing information and instructions.

Computer system 1700 may be coupled via bus 1702 to a display 1712, such as a cathode ray tube (CRT) or flat panel or touch panel display for displaying information to a computer user. An input device 1714, including alphanumeric and other keys, is coupled to bus 1702 for communicating information and command selections to processor 1704. Another type of user input device is cursor control 1716, such as a mouse, a trackball, or cursor direction keys for communicating direction information and command selections to processor 1704 and for controlling cursor movement on display 1712. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 1700 in response to processor 1704 executing one or more sequences of one or more instructions contained in main memory 1706. Such instructions may be read into main memory 1706 from another computer-readable medium, such as storage device 1710. Execution of the sequences of instructions contained in main memory 1706 causes processor 1704 to perform the process steps described herein. One or more processors in a multi-processing arrangement may also be employed to execute the sequences of instructions contained in main memory 1706. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1704 for execution. Such a medium may take many forms, including but not limited to, non-volatile media, volatile media, and transmission media. Non-volatile media include, for example, optical or magnetic disks, such as storage device 1710. Volatile media include dynamic memory, such as main memory 1706. Transmission media include coaxial cables, copper wire and fiber optics, including the wires that comprise bus 1702. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1704 for execution. For example, the instructions may initially be borne on a magnetic disk of a remote computer. The remote computer can load the instructions into its dynamic memory and send the instructions over a telephone line using a modem. A modem local to computer system 1700 can receive the data on the telephone line and use an infrared transmitter to convert the data to an infrared signal. An infrared detector coupled to bus 1702 can receive the data carried in the infrared signal and place the data on bus 1702. Bus 1702 carries the data to main memory 1706, from which processor 1704 retrieves and executes the instructions. The instructions received by main memory 1706 may optionally be stored on storage device 1710 either before or after execution by processor 1704.

Computer system 1700 may also include a communication interface 1718 coupled to bus 1702. Communication interface 1718 provides a two-way data communication coupling to a network link 1720 that is connected to a local network 1722. For example, communication interface 1718 may be an integrated services digital network (ISDN) card or a modem to provide a data communication connection to a corresponding type of telephone line. As another example, communication interface 1718 may be a local area network (LAN) card to provide a data communication connection to a compatible LAN. Wireless links may also be implemented. In any such implementation, communication interface 1718 sends and receives electrical, electromagnetic or optical signals that carry digital data streams representing various types of information.

Network link 1720 typically provides data communication through one or more networks to other data devices. For example, network link 1720 may provide a connection through local network 1722 to a host computer 1724 or to data equipment operated by an Internet Service Provider (ISP) 1726. ISP 1726 in turn provides data communication services through the worldwide packet data communication network, now commonly referred to as the "Internet" 1728. Local network 1722 and Internet 1728 both use electrical, electromagnetic or optical signals that carry digital data streams. The signals through the various networks and the signals on network link 1720 and through communication interface 1718, which carry the digital data to and from computer system 1700, are exemplary forms of carrier waves transporting the information.

Computer system 1700 can send messages and receive data, including program code, through the network(s), network link 1720, and communication interface 1718. In the Internet example, a server 1730 might transmit a requested code for an application program through Internet 1728, ISP 1726, local network 1722 and communication interface 1718. One such downloaded application may provide for a method or portion thereof as described herein, for example. The received code may be executed by processor 1704 as it is received, and/or stored in storage device 1710, or other non-volatile storage for later execution. In this manner, computer system 1700 may obtain application code in the form of a carrier wave.

The embodiments may further be described using the following clauses:

1. A method comprising:
obtaining a resist process dose sensitivity value for a patterning process;
applying, by a hardware computer, the resist process dose sensitivity value to a stochastic model providing values of a stochastic variable as a function of resist process dose sensitivity to obtain a value of the stochastic variable; and
designing or modifying a parameter of the patterning process based on the stochastic variable value.
2. The method of clause 1, wherein the function of resist process dose sensitivity comprises:

$$[a \cdot (DS)^b]$$

where DS is resist process dose sensitivity and a and b are fitted coefficients.
3. The method of clause 1 or clause 2, wherein the stochastic variable comprises feature edge or width roughness.
4. The method of any of clauses 1-3, wherein the stochastic model provides values of the stochastic variable as function of a resist quencher parameter.
5. The method of clause 4, wherein the resist quencher parameter is resist quencher flux.
6. The method of clause 5, wherein the function of resist quencher flux comprises:

$$(1 - c \cdot Q\text{flux})$$

wherein Qflux is resist quencher flux and c is a fitted coefficient.
7. The method of clause 6, wherein the function of resist quencher flux and resist process dose sensitivity comprises:

$$[a \cdot (DS)^b] \cdot (1 - c \cdot Q\text{flux}).$$

8. The method of any of clauses 1-7, further comprising creating a stochastic process variability band, based on the stochastic variable value, with respect to a pattern edge position, or producing a stochastic pattern edge by multiplying the stochastic variable value with a unit noise vector.
9. The method of clause 8, comprising creating the stochastic process variability band, based on the stochastic variable value, with respect to the pattern edge position, wherein the pattern edge position is an average edge position obtained from a lithographic model.
10. The method of any of clauses 1-9, wherein obtaining the resist process dose sensitivity value comprises using a lithographic model of the patterning process to compute the resist process dose sensitivity value based on a device pattern.
11. The method of any of clauses 1-10, further comprising:
obtaining predictions of resist process dose sensitivity from a lithographic model of the patterning process;
obtaining measured values of the stochastic variable; and
calibrating the stochastic model based on the predicted resist process dose sensitivities and the measured values of the stochastic variable.
12. The method of clause 10 or clause 11, wherein the lithographic model comprises an optical proximity correction model, a full physical model, and/or a blurred image model.
13. The method of clause 11 or clause 12, comprising obtaining resist quencher flux values and calibrating the stochastic model based on resist quencher flux values.
14. The method of clause 13, wherein the calibrating comprises determining an upper-bound of the resist quencher flux values as part of fitting the resist quencher flux values to the stochastic model.
15. The method of any of clauses 1-14, wherein values of the stochastic variable are dependent on a geometric dimension of a space between features of a pattern used in the patterning process.
16. A method comprising:
obtaining predictions of resist process dose sensitivity from a lithographic model of a patterning process;
obtaining measured values of a stochastic variable of the patterning process; and
calibrating, by a hardware computer, a model-based stochastic model predicting values of the stochastic variable, based on the predicted resist process dose sensitivities and the measured values of the stochastic variable.
17. The method of clause 16, wherein the lithographic model comprises an optical proximity correction model, a full physical model, and/or a blurred image model.
18. The method of clause 16 or clause 17, wherein the model-based stochastic model comprises a function of resist process dose sensitivity comprising:

$$[a \cdot (DS)^b]$$

where DS is resist process dose sensitivity and a and b are fitted coefficients.
19. The method of any of clauses 16-18, wherein the stochastic variable comprises feature edge or width roughness.
20. The method of any of clauses 16-19, wherein the model-based stochastic model provides values of the stochastic variable as function of a resist quencher parameter.
21. The method of clause 20, wherein the resist quencher parameter is resist quencher flux.

22. The method of clause 21, wherein the function of resist quencher flux comprises:

$$(1 - c \cdot Qflux)$$

wherein Qflux is resist quencher flux and c is a fitted coefficient.

23. The method of clause 22, wherein the function of resist quencher flux and resist process dose sensitivity comprises:

$$[a \cdot (DS)^b] \cdot (1 - c \cdot Qflux).$$

24. The method of any of clauses 16-23, comprising obtaining resist quencher flux values and calibrating the model-based stochastic model based on resist quencher flux values.

25. The method of clause 24, wherein the calibrating comprises determining an upper-bound of the resist quencher flux values as part of fitting the resist quencher flux values to the model-based stochastic model.

26. The method of any of clauses 16-25, wherein values of the stochastic variable are dependent on a geometric dimension of a space between features of a pattern used in the patterning process.

27. A method comprising:
calculating, by a hardware computer, a value of stochastic variable from a stochastic model of a patterning process, the stochastic model providing values of the stochastic variable as a function of a resist quencher parameter; and
designing or modifying a parameter of the patterning process based on the stochastic variable value.

28. The method of clause 27, wherein the stochastic variable comprises feature edge or width roughness.

29. The method of clause 27 or clause 28, wherein the stochastic model provides values of the stochastic variable as function of resist quencher flux.

30. The method of clause 29, wherein the function of resist quencher flux comprises:

$$(1 - c \cdot Qflux)$$

wherein Qflux is resist quencher flux and c is a fitted coefficient.

31. The method of clause 30, wherein the function of resist quencher flux comprises:

$$[a \cdot (DS)^b] \cdot (1 - c \cdot Qflux)$$

wherein DS is resist process dose sensitivity and a and b are fitted coefficients.

32. The method of any of clauses 27-31, further comprising creating a stochastic process variability band, based on the stochastic variable value, with respect to a pattern edge position, or producing a stochastic pattern edge by multiplying the stochastic variable value with a unit noise vector.

33. The method of clause 32, comprising creating the stochastic process variability band, based on the stochastic variable value, with respect to the pattern edge position, wherein the pattern edge position is an average edge position obtained from a lithographic model.

34. The method of any of clauses 27-33, further comprising:
obtaining resist quencher parameter values;
obtaining measured values of the stochastic variable; and
calibrating the stochastic model based on the resist quencher parameter values and the measured values of the stochastic variable.

35. The method of clause 34, comprising obtaining predicted resist process dose sensitivity values and calibrating the stochastic model based on the predicted resist process dose sensitivity values.

36. The method of clause 34 or clause 35, wherein the calibrating comprises determining an upper-bound of the resist quencher flux values as part of fitting the resist quencher flux values to the stochastic model.

37. The method of any of clauses 27-36, wherein values of the stochastic variable are dependent on a geometric dimension of a space between features of a pattern used in the patterning process.

38. A method comprising:
obtaining resist quencher parameter values for a patterning process;
obtaining measured values of a stochastic variable of the patterning process; and calibrating, by a hardware computer, a model predicting a value of the stochastic variable, based on the resist quencher parameter values and the measured values of the stochastic variable.

39. The method of clause 38, wherein the stochastic variable comprises feature edge or width roughness.

40. The method of clause 38 or clause 39, wherein the resist quencher parameter is resist quencher flux.

41. The method of clause 40, wherein the function of resist quencher flux comprises:

$$(1 - c \cdot Qflux)$$

wherein Qflux is resist quencher flux and c is a fitted coefficient.

42. The method of clause 41, wherein the function of resist quencher flux comprises:

$$[a \cdot (DS)^b] \cdot (1 - c \cdot Qflux)$$

wherein DS is resist process dose sensitivity and a and b are fitted coefficients.

43. The method of any of clauses 38-42, comprising obtaining resist process dose sensitivity predictions and calibrating the model based on the resist process dose sensitivity predictions.

44. The method of any of clauses 38-43, wherein the calibrating comprises determining an upper-bound of the resist quencher parameter values as part of fitting the resist quencher parameter values to the model.

45. The method of any of clauses 38-44, wherein values of the stochastic variable are dependent on a geometric dimension of a space between features of a pattern used in the patterning process.

46. A computer program product comprising a computer non-transitory readable medium having instructions recorded thereon, the instructions when executed by a computer implementing the method of any of clauses 1-45.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element" or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The descriptions above are intended to be illustrative, not limiting. Thus, it will be apparent to one skilled in the art that modifications may be made as described without departing from the scope of the claims set out below.

The invention claimed is:

1. A method comprising:
   obtaining a resist process dose sensitivity value for a patterning process;
   applying, by a hardware computer, the resist process dose sensitivity value to a stochastic model providing values of a stochastic variable as a function of a resist process dose sensitivity independent variable to obtain a value of the stochastic variable; and
   designing or modifying a parameter of the patterning process based on the stochastic variable value.

2. The method of claim 1, wherein the function of resist process dose sensitivity comprises:

$$[a \cdot (DS)^b]$$

where DS is resist process dose sensitivity and a and b are fitted coefficients.

3. The method of claim 1, wherein the stochastic variable comprises feature edge or width roughness.

4. The method of claim 1, wherein the stochastic model provides values of the stochastic variable as function of a resist quencher parameter.

5. The method of claim 4, wherein the resist quencher parameter is resist quencher flux and the function of resist quencher flux comprises:

$$(1 - c \cdot Q\text{flux})$$

wherein Qflux is resist quencher flux and c is a fitted coefficient.

6. The method of claim 1, further comprising creating a stochastic process variability band, based on the stochastic variable value, with respect to a pattern edge position, or producing a stochastic pattern edge by multiplying the stochastic variable value with a unit noise vector.

7. The method of claim 6, comprising creating the stochastic process variability band, based on the stochastic variable value, with respect to the pattern edge position, wherein the pattern edge position is an average edge position obtained from a lithographic model.

8. The method of claim 1, wherein obtaining the resist process dose sensitivity value comprises using a lithographic model of the patterning process to compute the resist process dose sensitivity value based on a device pattern.

9. The method of claim 1, further comprising:
obtaining predictions of resist process dose sensitivity from a lithographic model of the patterning process;
obtaining measured values of the stochastic variable; and
calibrating the stochastic model based on the predicted resist process dose sensitivities and the measured values of the stochastic variable.

10. The method of claim 9, comprising obtaining resist quencher flux values and calibrating the stochastic model based on resist quencher flux values.

11. The method of claim 1, wherein values of the stochastic variable are dependent on a geometric dimension of a space between features of a pattern used in the patterning process.

12. A method comprising:
obtaining resist quencher parameter values for a patterning process;
obtaining measured values of a stochastic variable of the patterning process; and
calibrating, by a hardware computer, a model predicting a value of the stochastic variable as a function of a resist quencher parameter variable, based on the resist quencher parameter values and the measured values of the stochastic variable.

13. The method of claim 12, wherein the resist quencher parameter is resist quencher flux.

14. The method of claim 13, wherein the model comprises a function of resist quencher flux, which function comprises:

$$(1-c \cdot Q\text{flux})$$

wherein Qflux is resist quencher flux and c is a fitted coefficient.

15. A computer program product comprising a non-transitory computer-readable medium having instructions therein, the instructions, upon execution by a computer system, configured to cause the computer system to at least:
obtain resist quencher parameter values for a patterning process;
obtain measured values of a stochastic variable of the patterning process; and
calibrate a model predicting a value of the stochastic variable as a function of a resist quencher parameter variable, based on the resist quencher parameter values and the measured values of the stochastic variable.

16. A computer program product comprising a non-transitory computer-readable medium having instructions therein, the instructions, upon execution by a computer system, configured to cause the computer system to at least:
obtain a resist process dose sensitivity value for a patterning process;
apply the resist process dose sensitivity value to a stochastic model providing values of a stochastic variable as a function of a resist process dose sensitivity independent variable to obtain a value of the stochastic variable; and
design or modify a parameter of the patterning process based on the stochastic variable value.

17. The computer program product of claim 16, wherein the function of resist process dose sensitivity comprises:

$$[a \cdot (DS)^b]$$

where DS is resist process dose sensitivity and a and b are fitted coefficients.

18. The computer program product of claim 16, wherein the stochastic model provides values of the stochastic variable as function of a resist quencher parameter.

19. The computer program product of claim 16, wherein the instructions are further configured to cause the computer system to create a stochastic process variability band, based on the stochastic variable value, with respect to a pattern edge position, or produce a stochastic pattern edge by multiplying the stochastic variable value with a unit noise vector.

20. The computer program product of claim 16, wherein the instructions configured to obtaining the resist process dose sensitivity value are further configured to use a lithographic model of the patterning process to compute the resist process dose sensitivity value based on a device pattern.

* * * * *